United States Patent
Lettner et al.

(10) Patent No.: US 6,681,148 B2
(45) Date of Patent: Jan. 20, 2004

(54) MONITORING SYSTEM FOR A CONVEYING DEVICE FOR FLAT ARTICLES, ESPECIALLY WAFERS

(75) Inventors: Hans Lettner, Landskron (AT); Xaver Kollmer, Marzling (DE); Günther Schindler, Hochbruck (DE); Ernst Georg Frisch, München (DE)

(73) Assignee: Logitex Reinstmedientechnik GmbH (DE)

( * ) Notice: Subject to any disclaimer, the term of this patent is extended or adjusted under 35 U.S.C. 154(b) by 13 days.

(21) Appl. No.: 10/149,046

(22) PCT Filed: Dec. 1, 2000

(86) PCT No.: PCT/EP00/12103
§ 371 (c)(1),
(2), (4) Date: Jun. 3, 2002

(87) PCT Pub. No.: WO01/40884
PCT Pub. Date: Jun. 7, 2001

(65) Prior Publication Data
US 2002/0182052 A1 Dec. 5, 2002

(30) Foreign Application Priority Data
Dec. 2, 1999 (DE) .......................................... 199 58 082

(51) Int. Cl.$^7$ ................................................. G06F 7/00
(52) U.S. Cl. ..................... 700/218; 700/258; 414/937
(58) Field of Search ................................. 700/213, 214, 700/218, 245, 258; 414/935, 937, 940

(56) References Cited

U.S. PATENT DOCUMENTS

| 4,803,373 | A | | 2/1989 | Imamura et al. | |
| 5,466,945 | A | * | 11/1995 | Brickell et al. | 250/559.12 |
| 5,604,443 | A | * | 2/1997 | Kitamura et al. | 324/754 |
| 5,605,428 | A | * | 2/1997 | Birkner et al. | 414/331.15 |
| 5,906,469 | A | * | 5/1999 | Oka et al. | 414/416.08 |
| 6,430,468 | B1 | * | 8/2002 | Tepman et al. | 700/218 |
| 6,516,244 | B1 | * | 2/2003 | Yoo et al. | 700/218 |

FOREIGN PATENT DOCUMENTS

| DE | 43 26 309 | 9/1984 |
| DE | 43 10 149 | 10/1994 |

OTHER PUBLICATIONS

JP 11179692.
JP 11150078.
JP 11254359.
JP 10041367.

* cited by examiner

Primary Examiner—Khoi H. Tran
(74) Attorney, Agent, or Firm—R W Becker & Associates; R W Becker

(57) ABSTRACT

The invention relates to a monitoring system for a conveying device for flat articles, especially wafers, which conveying device is provided with a carriage (28) that is movable along a predetermined path next to a flat article (10) that is located at a predetermined removal location, the carriage having a receiving device for the accommodation of the flat article (10), which monitoring system contains a light source (50) having a light-exit window and a light receiver (52) having a light-admission window, whereby the light-exit window and the light-admission window are positioned in such a way that a light beam (60) directed form the light-exit window to the light-admission window is partially covered by the carriage (28) during its movement through the light beam, and an evaluation unit that is connected to the light receiver and that compares a target signal derived from its movement of the carriage along a target path with an actual signal derived from an actual movement of the carriage, and indicates a deviation.

9 Claims, 4 Drawing Sheets

MONITORING SYSTEM FOR A CONVEYING DEVICE FOR FLAT ARTICLES, ESPECIALLY WAFERS

BACKGROUND OF THE INVENTION

The invention relates to a monitoring system for a conveying device for flat articles, especially wafers.

Wafers are thin disks of silicon, as they are used for the manufacture of integrated circuits, solar cells, etc. Such wafers must be handled extremely carefully in clean rooms, as they are transported, during the course of the manufacture of the integrated circuit, the solar cell, etc., from one processing step to a further processing step.

FIG. 3 shows a schematic view of an apparatus for carrying out various processing steps of a wafer.

Two racks 4,6 are disposed in a housing 2 that forms a supply or storage chamber; the racks have receptacles 8 (FIG. 5) that are disposed one above the other and in which can be accommodated disks 10.

Via a motor 11 and by means of a device that is not illustrated in detail, the housing 2 can be displaced back and forth on a stationary rail 12 in the direction of the double arrow 14, so that in one selected position, the one rack 4, and in the other selected position, the other rack 6, is located across from an opening 16 of a housing 18 that has further openings 20 to which the working chambers 22 are connected.

Disposed in a housing 18 is a robot 24 (FIG. 4) that is provided with a supporting arm 26 on which is disposed a carriage 28. The carriage 28 has an indentation 30, the base 32 of which is provided with vacuum slots 34 as well as capacitive proximity sensors 36.

To move the supporting arm 26, motors 38 and 40 are provided via which the supporting arm 26 is pivoted in a plane of movement that is perpendicular to a central axis of rotation of the robot 24, and via which the spacing of the supporting arm from the axis of rotation can be altered. The carriage 28 can be rigidly connected to the supporting arm 26, or can be displaceable on the carrying arm 26 via a non-illustrated further drive means.

FIG. 5 shows a perspective front view of the partially cut away or basically open toward the front housing 2, whereby two chambers are visible, of which only the left one is provided with the rack 4. The motor 10 serves for the back and forth movement of the housing 2 upon the rail 12. As can be seen, the housing 2 is not directly displaceable on the rail 12, but rather is disposed upon a frame element 42 that together with the housing 2 is displaceable along the rail 12. The housing 2 can be displaced in height relative to the frame element 42 via a servo-motor 44, in the direction of the double arrow 46, so that the individual receptacles 8, with the wafers 10 accommodated therein, though not illustrated in FIG. 5, can be positioned one after the other at the same height.

The construction and function of the previously described apparatus, various embodiments of which are offered in commerce by various firms, are known and will therefore not be described in detail.

The basic function is such that pursuant to FIG. 3, the robot 24, in a one time lined-up, horizontal plane, introduces the carriage 28 out of the opening 16 and into an oppositely disposed receptacle of the rack 4. With the aid of the servo motor 44, the rack 4 is then lowered slightly vertically until the proximity sensors 36 register the approach of a wafer 10 that is disposed upon a base of a receptacle 8. With a further lowering of the rack 4, the wafer 10 comes to rest upon the base 32 of the indentation 30, where it is held in place upon activation of the vacuum slots 34. The carriage 28 subsequently moves out of the rack 4 into the interior of the housing 18 and through a first one of the openings 20 into a first one of the working chambers 22, where it is deposited and processed. The wafer 10 is subsequently picked up by the carriage 28 and introduced into a next one of the working chambers, etc. until, after passing through the processing steps in the individual working chambers 22, the wafer is deposited by the carriage 28 in the right rack 6 of FIG. 3, whereby pursuant to FIG. 3 the housing 2 is moved toward the left. The carriage 28 is subsequently moved out of the rack 6, the housing is moved toward the right and the next wafer is picked up from the rack 4 by first lowering the rack by the height of one receptacle, so that after the carriage 28 has been introduced into the next receptacle, and after a subsequent further lowering of the rack 4, the next wafer 10 comes to rest on the carriage 28.

The individual openings 16 and 20 of the housing 18 can be sealed off via vacuum-type slides, so that on the whole it is possible to operate under vacuum.

A problem that arises when processing with the described apparatus is that the carriage 28 that is moved by the robot 24 alters its horizontal plane of movement, either due to wear or due to high thermal stresses as it is introduced into the working chambers 22, which are in part under high temperature. The vertical distance between the individual receptacles 18 in the racks 4 and 6 is relatively small, so that already a slight deformation or deflection of the carriage out of its targeted path of movement brings with it the danger that already upon its introduction into the rack 4 the carriage contacts a wafer and damages it, or that the wafer is then no longer satisfactorily deposited upon the carriage.

It is an object of the invention to provide a remedy for the aforementioned problem.

SUMMARY OF THE INVENTION

This object is realized by a monitoring system pursuant to the main claim.

The inventive monitoring system ensures that already slight deviations of the carriage movement from the targeted path of the carriage are detected and can be indicated. In this way, expensive damage to the wafers can be avoided.

It is to be understood that the inventive monitoring system for conveying devices pursuant to the main claim is suitable for many different types of flat articles, such as fragile, thin mica plates, thin ceramic plates, loaded printed circuit boards, etc. The inventive monitoring system is particularly well suited for conveying devices for wafers, the handling of which is subjected to particularly high requirements.

The dependent claims are directed to advantageous embodiments and further developments of the inventive monitoring system.

BRIEF DESCRIPTION OF THE DRAWINGS

The inventive monitoring system is explained subsequently with the aid of schematic drawings by way of example and with further details.

The drawings represent.

DESCRIPTION OF PREFERRED EMBODIMENTS

Figure 1:
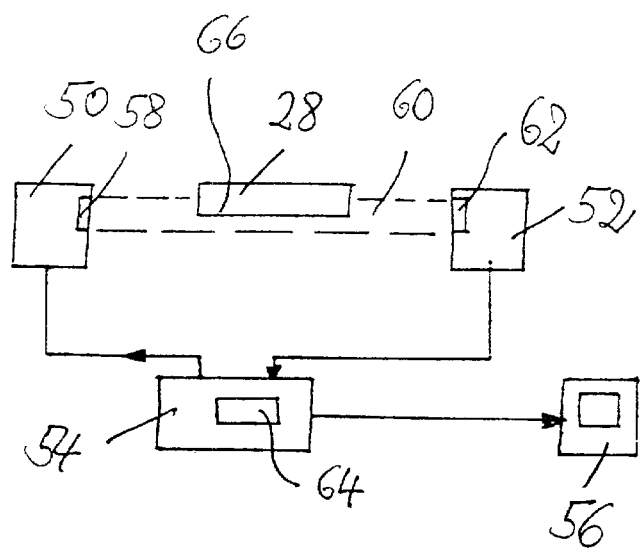
FIG. 1 a block diagram of the monitoring system.

The inventive monitoring system contains a light source 50 and a light receiver 52 that is spaced from the light source 50 and is connected with a control device 54 to which is connected an indicator 56.

The light source 50 advantageously contains a laser light source, the light of which is influenced by an optical system in such a way that a parallel light beam 60 (indicated by dashed lines) exits from an exit window 58 that is embodied in the form of a vertical slot. The light beam 60 enters an admission window 62, of the light receiver 52, that is disposed across from the exit window 58 and is advantageously embodied in conformity with the exit slot. The light that enters the admission window 62 is focused on a photo diode, the output signal of which is supplied to the control device 54.

In a manner known per se, the control device 54 contains a microprocessor and an evaluation unit 64, the function of which will be explained in detail subsequently.

Figure 3:
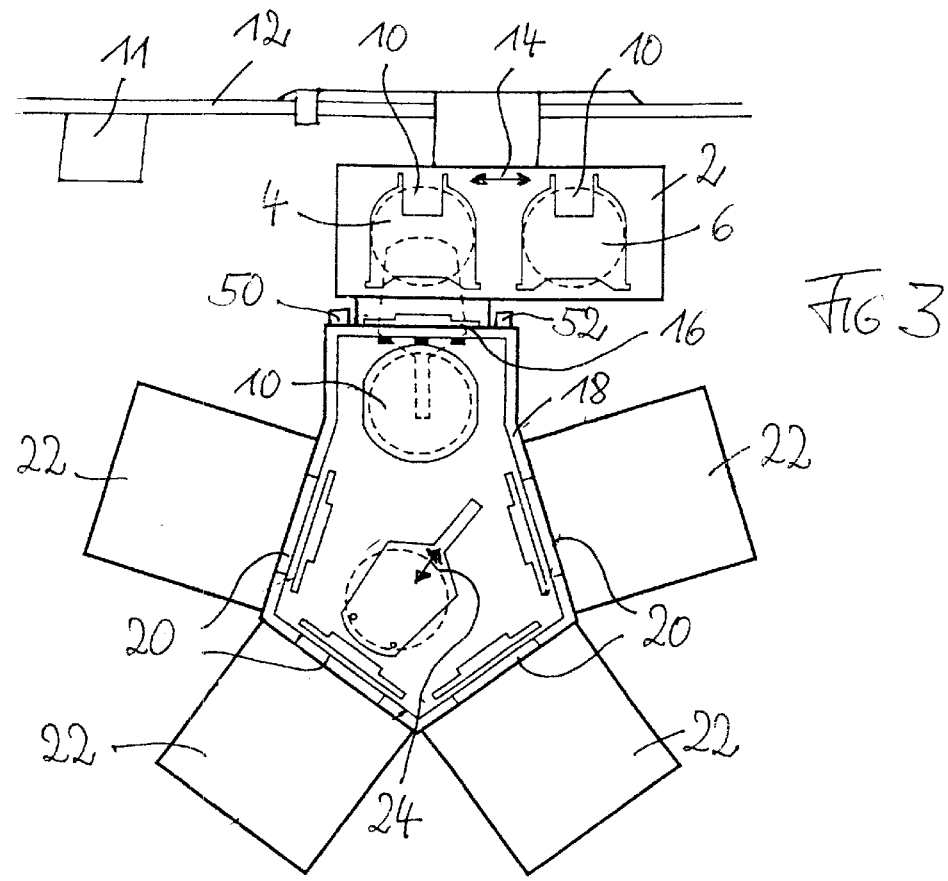
FIG. 3 the already described view of a processing apparatus for wafers.

As can be seen from FIG. 3, the light source 50 is mounted on the stationary housing 18 on one side of the opening 16, and the light receiver 52 is mounted on the other side of the opening 16.

FIG. 1 illustrates how movement of the carriage 28, which is movable essentially perpendicular to the plane of the drawing sheet, intersects or covers the light beam 60. The target plane of movement, in which the carriage 28 moves during its movement into the rack 4 and out of the rack 4, is such that the underside 66 of the carriage 28 intersects the light beam 60 at a prescribed height, so that a corresponding prescribed height of the admission window 62 is shaded, and the output signal of the light receiver 52 is correspondingly reduced.

Figure 2:
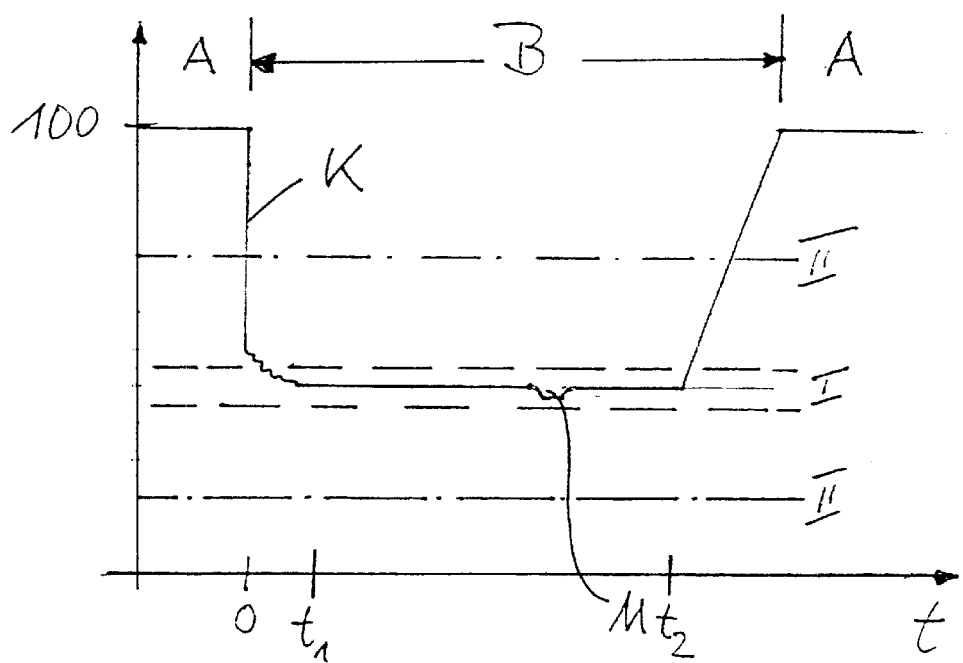
FIG. 2 curves to explain the functioning of the monitoring system.

In FIG. 2, the curve K represents a measurement curve that represents the exit signal of the light receiver 52. In the region A there is no object between the light source 50 and the light receiver 52, so that the latter receives the full light intensity, which in the evaluation unit 64 is set to one hundred. If the carriage 28 is moved into the light beam 60, the intensity of the light falling upon the light receiver 52 drops suddenly, depending upon the contour of the carriage, which is recognized by the evaluation unit 64 and sets a counting or time signal to zero. Depending upon the contour of the carriage 28, the curve K, as the carriage 28 moves through the light beam 60, assumes a characteristic path (the brief deviation from the horizontal path in the form of the drop M indicates, for example, a screw that projects from the underside 66 of the carriage 28), in order then, depending upon the contour of the carriage, to again increase until the carriage has moved completely through the light beam 60 and in the region A the output signal again assumes its original value.

Depending upon the design of the control device 54, the curve K can be recorded at various cycle frequencies and can be evaluated in various ways. In the case of FIG. 2, the region I between the dashed lines represents a very narrow precision range within which must lie an average value of the output signal that is formed, for example, between the metering positions $t_1$ and $t_2$, so that the movement of the carriage is recognized as being in order to a high degree. As long as the measured value lies between the dot-dashed curves II, the movement of the carriage is seen as being still tolerable. Beyond the range II, the movement is seen as not being tolerable, and leads to an indication of error or malfunction.

In the indicator 56, the indication can be effected directly upon a screen, in a manner similar to what is shown in FIG. 2, and/or the indication can be effected via diodes, with green diodes indicating "in order", yellow diodes indicating "still tolerable", and red diodes indicating an insufficient precision of movement that requires a readjustment or the like of the carriage.

It is to be understood that a number of other evaluation possibilities exist, and that the monitoring apparatus can be installed as an independent system, or can be integrated into the control system of the motors or the robot and the drive of the housing 2 in a horizontal and vertical direction by supplying, for example, appropriate time markers from the control device of the electric motors to the control device 54, etcetera.

It is also to be understood that a drift of the measurement result can be detected, so that systematic variations can be observed and extrapolated, as a result of which errors can be predicted. Furthermore, it is possible to dispose behind the admission window 62 a diode strip, so that the absolute value of the level of the underside 66 below the light beam 60 can be detected directly.

Furthermore, the arrangement can also be embodied in such a way that the upper side of the carriage 28 is scanned, so that initially the upper side of the carriage is detected beyond the indentation 30, and then a wafer disposed in the indentation 30 is detected, so that with the monitoring of the satisfactory movement of the carriage the satisfactory position of the disk and even the satisfactory quality of the disk itself can be monitored.

By calibrating the output signal, with the admission window 62 not covered, respectively to one hundred, there results an extensive insensibility to variations of the light intensity of the light source 50 and to contaminations.

Figure 4:
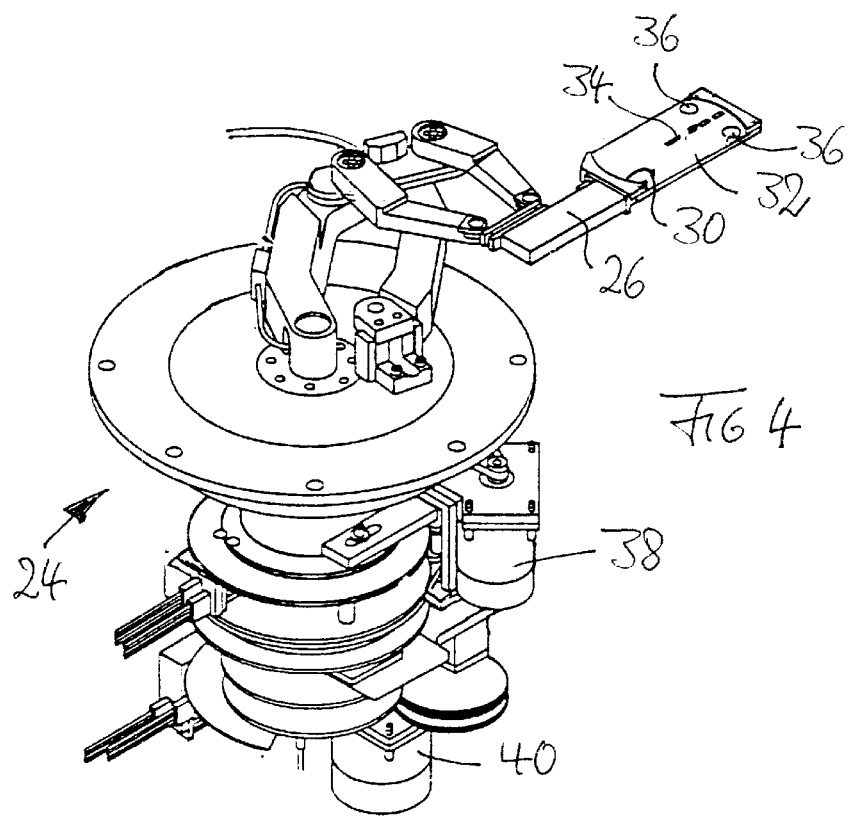
FIG. 4 a perspective view of a robot used in the apparatus of FIG. 3.
Figure 5:
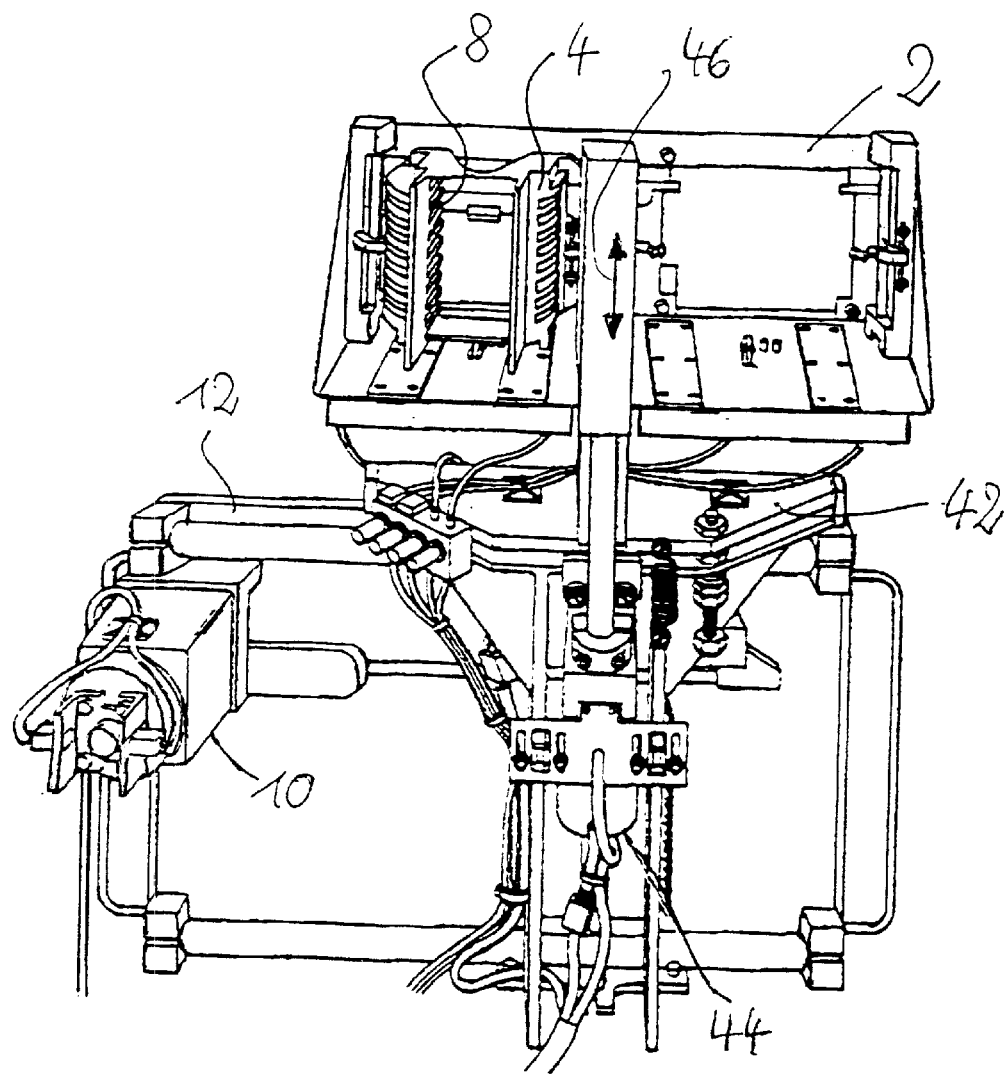
FIG. 5 a perspective front view of the apparatus of FIG. 3.
Figure 6:
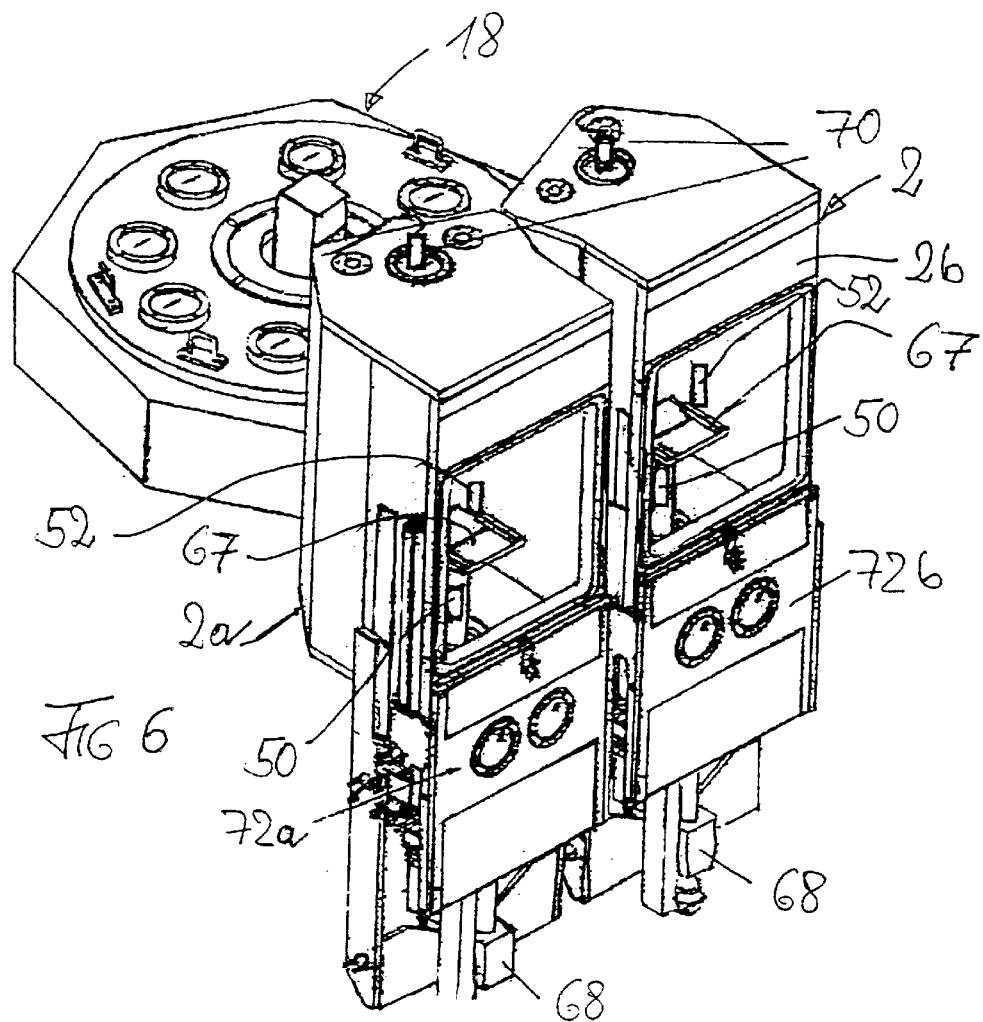
FIG. 6 a perspective view of a modified embodiment of a wafer-processing apparatus, and FIG. 7 a cross-sectional view through a preparation chamber of the apparatus of FIG. 5.

FIG. 6 shows a modified embodiment of a wafer-processing apparatus, whereby for functionally similar components the same reference numerals are used as in FIGS. 3 to 5. With regard to the direction of viewing, the view of FIG. 6 corresponds to a view of the arrangement of FIG. 5 at an angle from behind. The housing 2, which accommodates a non-illustrated rack 4 and 6, contains two hermetically sealable housing components 2a and 2b, which contain vacuum chambers in which are accommodated support means 67 for the magazines or racks 4 and 6 (FIGS. 3 and 5). The support means 67 are movable vertically by means of servo-motors 68. The overall housing 2 is rigidly secured on a frame (not illustrated). In contrast to the embodiment of FIG. 3, where the light source 50 and the light receiver 52 are disposed on the housing 18 that accommodates the robot, with the embodiment of FIG. 6 there is disposed within each housing portion 2a and 2b a light source 50 and a light receiver 52 that are connected via cables 70 to the control device 54 (FIG. 1).

The receiving chambers formed in the housing portions 2a and 2b are open in FIG. 6, and can be closed in an airtight manner via slides 72a and 72b. With the slides 72a and 72b open, racks that are supplied with wafers can be inserted or removed at the support means 67.

Figure 7:
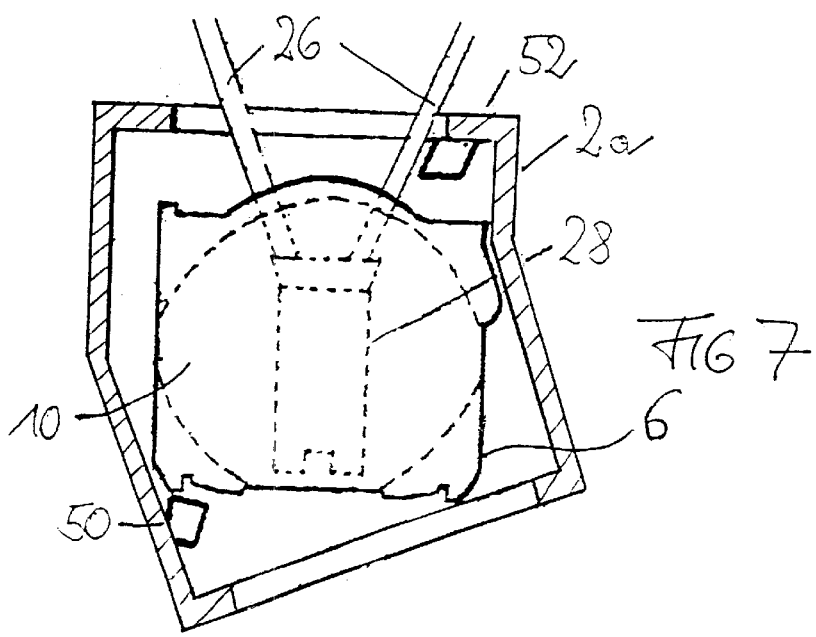

The geometrical arrangement can be seen from FIG. 7, which represents a horizontal cross-section through the housing portion 2a. Visible are the light source 50, the light receiver 52, the carriage 28, the rack 6 and a wafer 10. The arrangement of the light source 50 and of the light receiver 52, and the dimensions, are such that the light beam 60 (FIG. 1) freely passes through a gap between two receptacles or compartments that are provided with wafers 10 when the carriage 8 is not disposed within the rack 6 and the rack is in a predetermined step position. The functional sequence of the monitoring system when using the embodiment of FIGS. 6 and 7 is as follows:

With the carriage 28 located outside of the housing 2 or one of the housing portions 2, by actuating the stepping motors 68 the magazines are respectively in a position in which the light beam passes through the gap between two receptacles without being covered, i.e. in the graph of FIG. 2 there results a signal value in the region A, in other words a maximum value of the output signal of the light receiver or receivers 52. In the following, the function is described for only one of the magazines, for example the non-illustrated magazine that in FIG. 6 is located in the right housing portion 2b. If in the position of the carriage 28 located outside of the housing portion 2b the maximum value of the light intensity is not measured, this indicates an error of the pertaining stepping motor 68 or of its control. The monitoring system can be used to control the actuation of the stepping motor 68 by actuating this motor for such a length of time until the maximum light intensity is achieved. This can occur by trials for an overall, newly inserted magazine that may be loaded with wafers, so that the magazine imprecisions can be compensated for by always actuating the stepping motor 68 in such a way that the gap between two receptacle bases is arranged in such a way that the light beam 60 passes completely there through. It is to be understood that it is advantageous for the height dimension of the light beam 60 to be slightly less than the spacing between two receptacle bases so that the maximum output signal is ensured.

In the predetermined position of the magazine, which is controlled with the aid of the light beam, the transport arm 26 is now moved into the housing portion 2b into the gap between two receptacle bases, i.e. two disks, the rims of which are accommodated by the receptacle bases, whereby this movement is monitored pursuant to FIG. 2. The monitoring differs somewhat from the illustration of FIG. 2 in that the carriage is moved out of the left region A only in the region B, and not completely through the light beam. The rack is subsequently lowered, whereby the lowering is effected by only a certain amount, or, if the proximity sensors 36 (FIG. 4) are provided, the lowering is controlled via the proximity sensors 36. The wafer that rests upon the carriage is then held securely in place with the aid of a supply of vacuum to the vacuum slots 34, and is moved out of the housing portion 2a.

The deposit of the finish-processed wafer in the rack accommodated in the other housing portion 2a is effected in a manner analogous to that explained in conjunction with FIGS. 3 to 5, whereby the height position of the rack can, as described, be additionally monitored.

Thus, on the whole, with the inventive monitoring system described by way of example, in the production apparatus a targeted monitoring is possible at extremely low equipment expense (light emitter and light receiver), whereby the monitoring of the vertical movement of the rack, which is provided with the receptacles for accommodating the wafers, and the movement of the carriage that transports the wafers, utilizes only one light receiver and light emitter, whereby the light receiver generates merely a simple output signal that corresponds to an overall irradiation intensity.

The specification incorporates by reference the disclosure of German priority document 19958 082.0 filed Dec. 2, 1999 and International priority document PCT/EP00/12103 filed Dec. 1, 2000.

The present invention is, of course, in no way restricted to the specific disclosure of the specification and drawings, but also encompasses any modifications within the scope of the appended claims.

What is claimed is:

1. A monitoring system for a conveying device for flat articles, wherein said conveying device is provided with a carriage having receiving means for accommodating a flat article, said carriage being movable along a predetermined path next to a flat article that is located at a predetermined removal location, said monitoring system comprising;

a light source having a light-exit window;

a light receiver having a light-admission window, wherein said light-exit window and said light-admission window are positioned such that a light beam directed from said light-exit window to said light-admission window can be partially covered by said carriage during its movement;

and an evaluation unit connected to said light receiver, wherein said path of movement of said carriage intersects said light beam between said light-exit window and said light-admission window and is disposed such that said carriage, even during movement along a predetermined target path thereof, moves from a position beyond said light beam into a position within said light beam, and wherein said evaluation unit compares a target signal, which is derived from movement of said carriage along said predetermined target path, with an actual signal, which is derived from an actual movement of said carriage, and indicates any deviation between such signals.

2. A monitoring system according to claim 1, wherein said predetermined path of said carriage extends in a plane, and wherein said light beam is directed parallel to said plane.

3. A monitoring system according to claim 1, wherein said light source is a laser light source, and wherein said light-exit window and said light-admission window are embodied as slots that are directed perpendicular to a plane of said path of movement and between which said light beam extends as a parallel light beam.

4. A monitoring system according to claim 2, wherein said carriage is provided with an underside that is directed approximately parallel to said plane of said path of movement and which, during movement of said carriage along said target path, intersects said light beam.

5. A monitoring system according to claim 3, wherein said evaluation unit determines at least one of a target signal and an actual signal by relating an output signal of said light receiver without covering a slot to at least one output signal of said light receiver where the slot is covered.

6. A monitoring system according to claim 5, wherein a plurality of output signals obtained during covering of a slot are determined.

7. A monitoring system according to claim 6, wherein determination of output signals received during covering of a slot is triggered by a reduction of an output signal at a beginning of covering of the slot.

8. A monitoring system according to claim 2, wherein a rack is provided that has receptacles that are spaced perpendicular to said plane of the movement of said carriage for receiving a plurality of flat articles, wherein said rack is movable in stages perpendicular to said path of movement of said carriage such that a flat article accommodated in one of said receptacles passes into said predetermined removal location, and wherein said light source and said light receiver are disposed such that said light beam passes through gaps that are formed between said receptacles with a predetermined covering by means of a portion of said rack when said rack, after removal of a flat article, and movement of said carriage with said flat article disposed thereon out, is moved into a predetermined new position, whereby said evaluation unit indicates an error if the output signal of said light receiver does not correspond to said predetermined covering.

9. A monitoring system according to claim 8, wherein in said predetermined new position of said rack said light beam is not covered.

* * * * *

UNITED STATES PATENT AND TRADEMARK OFFICE
CERTIFICATE OF CORRECTION

PATENT NO. : 6,681,148 B2
DATED : January 20, 2004
INVENTOR(S) : Leitner et al.

Page 1 of 1

It is certified that error appears in the above-identified patent and that said Letters Patent is hereby corrected as shown below:

<u>Title page,</u>
Item [75], Inventors, should read as follows:
-- [75]  Inventors:  Hans Leitner, Landskron (AT); Xaver Kollmer, Marzling (DE); Günther Schindler, Haimhausen (DE); Ernst Georg Frisch, München (DE) --

Signed and Sealed this

Eleventh Day of May, 2004

JON W. DUDAS
*Acting Director of the United States Patent and Trademark Office*